(12) United States Patent
Kwon et al.

(10) Patent No.: US 10,410,727 B2
(45) Date of Patent: Sep. 10, 2019

(54) NON-VOLATILE MEMORIES AND DATA READING METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yi Jin Kwon, Shanghai (CN); Hao Ni, Shanghai (CN); Jim Chia-Ming Hsu, Shanghai (CN); Xiao Yan Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/641,781

(22) Filed: Jul. 5, 2017

(65) Prior Publication Data
US 2018/0012664 A1    Jan. 11, 2018

(30) Foreign Application Priority Data

Jul. 7, 2016  (CN) .......................... 2016 1 0531757

(51) Int. Cl.
*G11C 16/28* (2006.01)
*G11C 16/08* (2006.01)
(Continued)

(52) U.S. Cl.
CPC .............. *G11C 16/28* (2013.01); *G11C 7/062* (2013.01); *G11C 16/08* (2013.01); *G11C 16/24* (2013.01); *G11C 16/26* (2013.01); *G11C 16/30* (2013.01)

(58) Field of Classification Search
None
See application file for complete search history.

(56) References Cited

U.S. PATENT DOCUMENTS

| 2013/0235678 A1 | 9/2013 | McCollum et al. |
| 2014/0016390 A1* | 1/2014 | Zhao ...................... G11C 11/16 365/63 |

OTHER PUBLICATIONS

The European Patent Office (EPO) The Extended European Search Report for 17179922.4 dated Oct. 18, 2017 12 Pages.
(Continued)

*Primary Examiner* — Douglas King
(74) *Attorney, Agent, or Firm* — Anova Law Group, PLLC

(57) ABSTRACT

A non-volatile memory (NVM) includes at least one memory unit region, each including a memory array and having first memory cells in the odd columns and second memory cells in the even columns. Corresponding to each memory unit region, the NVM includes a multiplexer including first bit line decoders and second bit line decoders, a comparator circuit including a first input terminal and a second input terminal, and a bias generation circuit generating a bias voltage. When reading a data information from a first memory cell, a first output voltage of the first memory cell is sent to the first input terminal and the bias voltage is sent to the second input terminal. When reading a data information from a second memory cell, a second output voltage of the second memory cell is sent to the second input terminal and the bias voltage is sent to the first input terminal.

11 Claims, 5 Drawing Sheets

(51) Int. Cl.
  *G11C 16/24* (2006.01)
  *G11C 16/30* (2006.01)
  *G11C 7/06* (2006.01)
  *G11C 16/26* (2006.01)

(56) References Cited

OTHER PUBLICATIONS

Adel S. Sedra et al. "Microelectronic Circuits 5th Edition" In: "Microelectronic Circuits", 2004, Oxford Univ. Press, New York, NY, XP055413506, ISBN: 978-0-19-514252-5 pp. 274-274.

* cited by examiner

NON-VOLATILE MEMORIES AND DATA READING METHODS THEREOF

CROSS-REFERENCES TO RELATED APPLICATIONS

This application claims the priority of Chinese Patent Application No. CN201610531757.2, filed on Jul. 7, 2016, the entire content of which is incorporated herein by reference.

FIELD OF THE DISCLOSURE

The present disclosure generally relates to the field of communication technology and, more particularly, relates to non-volatile memories and fabrication methods thereof.

BACKGROUND

Semiconductor memories used to store data are usually classified into volatile memories and non-volatile memories (NVMs). Data stored in the volatile memories may be lost when the power supplies are terminated. However, NVMs may still be able to keep the stored data after power outage. Compared to various volatile memories used in current memory technology such as disk drives, NVMs may have relatively smaller sizes. Therefore, NVMs have been more and more widely used in mobile communication systems, computers, memory cards, etc.

NVMs demonstrate capabilities in multi-time data storing, data reading, and data erasing. In general, an NVM usually includes a plurality of memory cells arranged into a matrix, a plurality of word lines arranged along the horizontal direction of the matrix, and a plurality of bit lines arrange along the longitudinal direction of the matrix.

During data reading operation, a bit line voltage is usually applied to the bit line corresponding to the memory cell in which the data to be read is stored. In addition, a sense amplifier (SA) is used. Specifically, one terminal of the SA receives the output voltage of the memory cell while the other terminal of the SA receives a bias voltage sent from a bias voltage source. The SA then compares the output voltage of the memory cell and the reference voltage from the bias voltage source to determine the information stored in the memory cell corresponding to logical '1' or logical '0'.

However, the data reading accuracy of existing NVMs may still need to be improved. The disclosed NVMs and data reading methods thereof are directed to solve one or more problems set forth above and other problems in the art.

BRIEF SUMMARY OF THE DISCLOSURE

One aspect of the present disclosure includes a non-volatile memory (NVM). The NVM includes at least one memory unit region. Each memory unit region includes a plurality of memory cells arranged into a memory array. The memory cells in odd columns of the memory array are first memory cells, and the memory cells in even columns of the memory array are second memory cells. Corresponding to each memory unit region, the NVM includes a plurality of bit lines including odd bit lines connected to the first memory cells and even bit lines connected to the second memory cells, a multiplexer (Y-mux) including a plurality of first bit line decoders connected to the odd bit lines and a plurality of second bit line decoders connected to the even bit lines, a comparator circuit, and a bias generation circuit used to generate a bias voltage. The comparator circuit includes a first input terminal connected to the plurality of first bit line decoders, a second input terminal connected to the plurality of second bit line decoders, and an output terminal. Moreover, during an operation to read the data information stored in a first memory cell, the Y-mux is controlled to send a first output voltage from the first memory cell to the first input terminal of the comparator circuit, and the bias generation circuit is controlled to send the bias voltage to the second input terminal of the comparator circuit; and during an operation to read the data information stored in a second memory cell, the Y-mux is controlled to send a second output voltage from the second memory cell to the second input terminal of the comparator circuit, and the bias generation circuit is controlled to send the bias voltage to the first input terminal of the comparator circuit.

Another aspect of the present disclosure provides a method for reading data information stored in an NVM. The method includes providing an NVM. The NVM includes at least one memory unit region, each including a plurality of memory cells arranged into a memory array. The memory cells in odd columns of the memory array are first memory cells, and the memory cells in even columns of the memory array are second memory cells. Corresponding to each memory unit region, the NVM includes a plurality of bit lines including odd bit lines connected to the first memory cells and even bit lines connected to the second memory cells, a multiplexer (Y-mux) including a plurality of first bit line decoders connected to the odd bit lines and a plurality of second bit line decoders connected to the even bit lines, a comparator circuit, and a bias generation circuit used to generate a bias voltage. The comparator circuit includes a first input terminal connected to the plurality of first bit line decoders, a second input terminal connected to the plurality of second bit line decoders, and an output terminal. Further, during an operation to read the data information stored in a first memory cell, the method includes sending a first output voltage from the first memory cell to the first input terminal of the comparator circuit through the Y-mux and the bias voltage to the second input terminal of the comparator circuit through the bias generation circuit. Moreover, during an operation to read the data information stored in a second memory cell, the method includes sending a second output voltage from the second memory cell to the second input terminal of the comparator circuit through the Y-mux, and the bias voltage to the first input terminal of the comparator circuit through the bias generation circuit.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
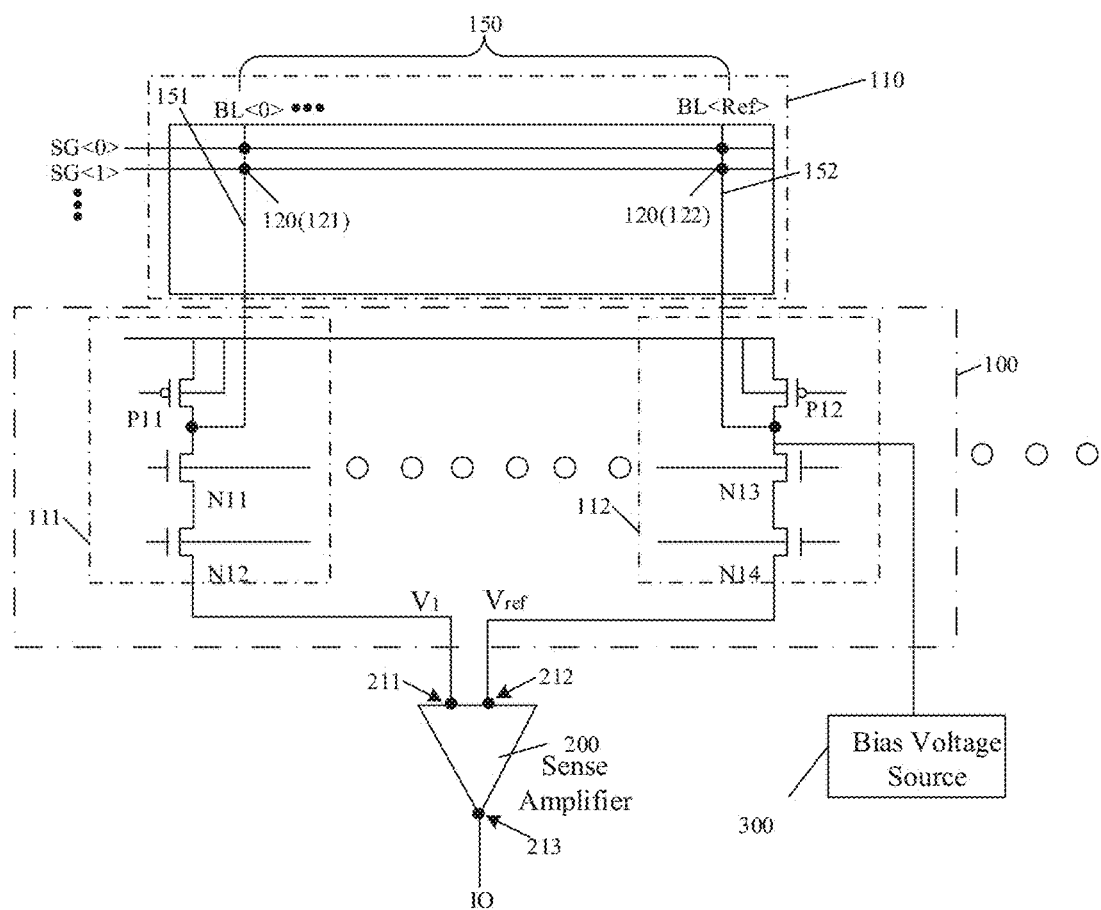
FIG. 1 illustrates a schematic circuit diagram of an existing NVM.
Figure 2:
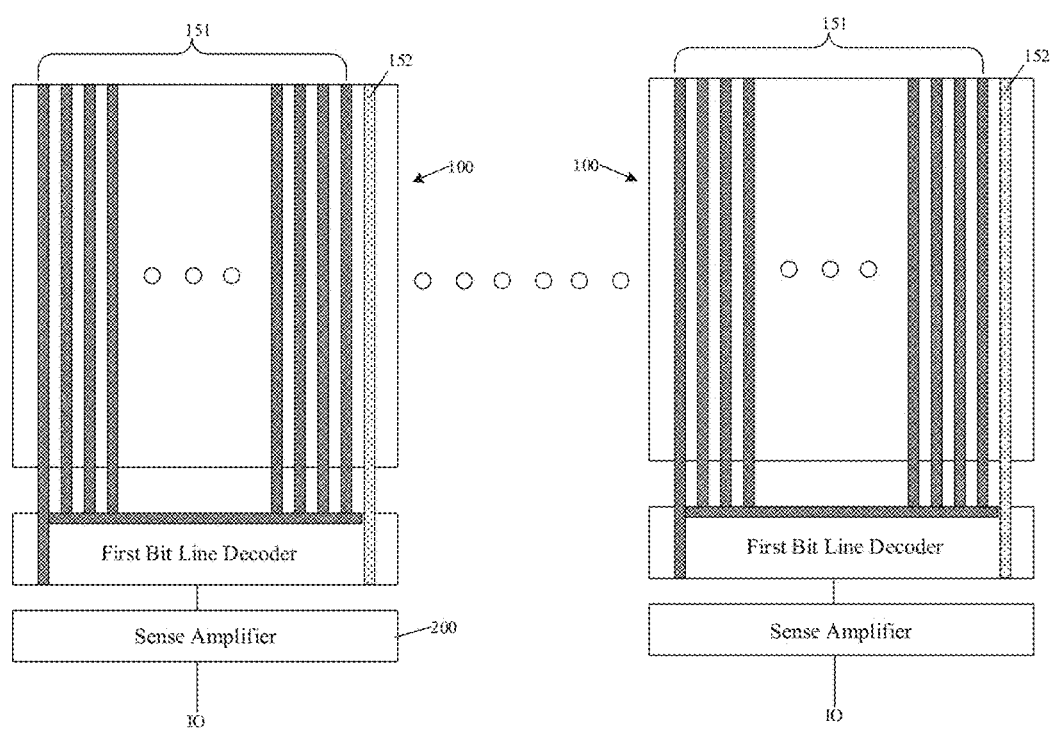
FIG. 2 illustrates a schematic local circuit diagram of the existing NVM shown in FIG. 1.

According to existing fabrication methods and semiconductor structures, the data reading accuracy of existing NVMs may still need to be improved. In the following, an example will be given to illustrate the reasons for the poor data reading accuracy of existing NVMs. FIG. 1 shows a schematic circuit diagram of an existing NVM. FIG. 2 shows a portion of the circuit diagram shown in FIG. 1.

Referring to FIG. 1, the NVM includes a plurality of memory cells 120 arranged in a matrix to form a memory array. Each memory cell 120 stores one bit of information. The NVM also includes a plurality of bit lines 150 and the memory cells 120 arranged in a same column of the memory array share a common bit line 150.

As shown in FIG. 1, the plurality of memory cells 120 form a memory unit region 110. The NVM includes a plurality of memory unit regions 110 arranged in parallel with each other. For illustration purpose, only one memory unit region 110 is shown in FIG. 1. The bit lines 150 in the memory unit region 110 further include a plurality of main bit lines 151 and a reference bit line 152. The main bit lines 151 are all formed on one side of the reference bit line 152. For example, in the memory unit region 110 shown in FIG. 1, the plurality of main bit lines 151 include BL<0>, BL<1>, BL<2>, ... BL<n−1>, where n is a positive integer; while the reference bit line 152 includes BL<Ref>. Moreover, the bit lines 150 in other memory unit regions (not shown) are also arranged in the same way as described above.

Moreover, the plurality of memory cells 120 connected with the main bit lines 151 are first memory cells 121. The plurality of first memory cells 121 arranged in a same column of the memory array share a same main bit line 151. In addition, the plurality of memory cells 120 connected with the reference bit line 152 are second memory cells 122.

Corresponding to the plurality of main bit lines 151, the NVM also includes a plurality of first bit line decoders 111. Each first bit line decoder 111 is connected to a corresponding main bit line 151 and includes a P-type MOS (PMOS) transistor P11, an N-type MOS (NMOS) transistor N11, and another NMOS transistor N12. The plurality of first bit line decoders 111 are configured to send out a first output voltage $V_1$ from the plurality of first memory cells 121 on the main bit lines 151.

The NVM further includes a bias voltage source 300. The bias voltage source 300 is configured to generate a bias voltage $V_{ref}$. The bias voltage source 300 is connected to a second bit line decoder 112. The second bit line decoder 112 includes a PMOS transistor P12, an NMOS transistor N13, and another NMOS transistor N14. The second bit line decoder 112 is configured to send out the bias voltage $V_{ref}$.

The plurality of first bit line decoders 111 and the second bit line decoder 112 together form a multiplexer (Y-Mux) 100. The Y-mux 100 has two output terminals. The plurality of first bit line decoders 111 and the second bit line decoder 112 in the Y-mux 100 are collectively controlled by decoder signals to send a first output voltage $V_1$ and the bias voltage $V_{ref}$ respectively to the two terminals of the Y-mux 100. Specifically, when the data information stored in a first memory cell 121 needs to be read out, the decoder signals are sent to the plurality of first bit line decoders 111 during the data reading operation to allow an output terminal of the Y-mux 100 to send out the corresponding first output voltage $V_1$; simultaneously, the decoder signals also controls the other output terminal of the Y-Mux 100 to send out the bias voltage $V_{ref}$.

Further, the NVM also includes an SA 200 corresponding to each memory unit region 110. The SA 200 is used to compare the first output voltage $V_1$ and the bias voltage $V_{ref}$ sent from the Y-mux 100, to obtain the data information stored in the corresponding first memory cell 121. Specifically, the SA 200 includes a first input terminal 211, a second input terminal 212, and an output terminal 213. The first input terminal 211 is used to receive the first output voltage $V_1$ and the second input terminal 212 is used to receive the bias voltage $V_{ref}$. During data reading operation of the NVM, when the first output voltage $V_1$ is smaller than the bias voltage $V_{ref}$, the information read from the corresponding first memory cell 121 is logical '0'; while when the first output voltage $V_1$ is larger than the bias voltage $V_{ref}$, the information read from the corresponding first memory cell 121 is logical '1'.

However, the structure of the main bit line 151 may be different from the structure of the reference bit line 152 and the fabrication process for the main bit line 151 may also be difference from the fabrication process of the reference bit line 152. Therefore, the difference in the electrical performance (such as leakage current, parasitic capacitance, etc.) of the main bit line 151 and the reference bit line 152 may not be kept in a process-allowed range. With repeat operation of data storing, data reading, and data erasing, the difference in the electrical properties (such as leakage current, parasitic capacitance, etc.) of the main bit line 151 and the reference bit line 152 may continuously increase, which may easily cause an increased possibility of getting a false result from the comparison between the first output voltage $V_1$ and the reference voltage $V_{ref}$, and thus may further lead to decreased data reading accuracy.

Figure 3:
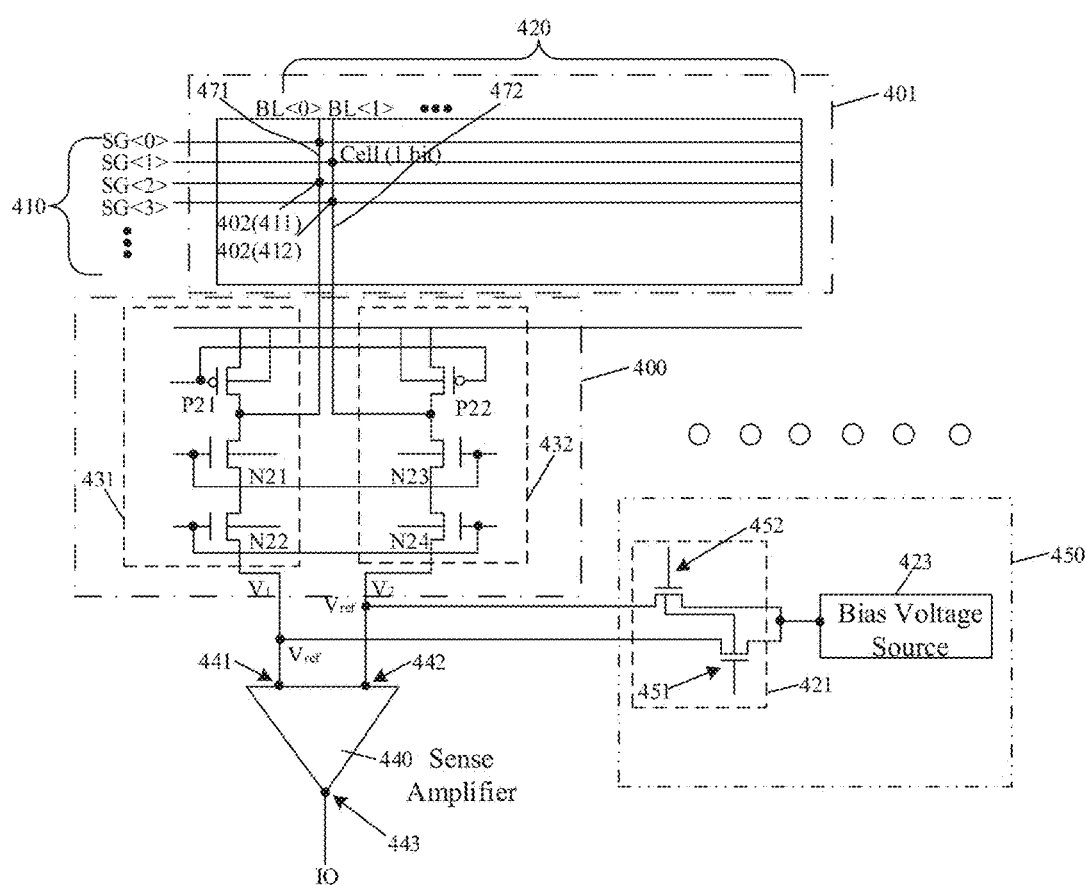
FIG. 3 illustrates a schematic circuit diagram of an exemplary NVM consistent with various disclosed embodiments in the present disclosure.
Figure 4:
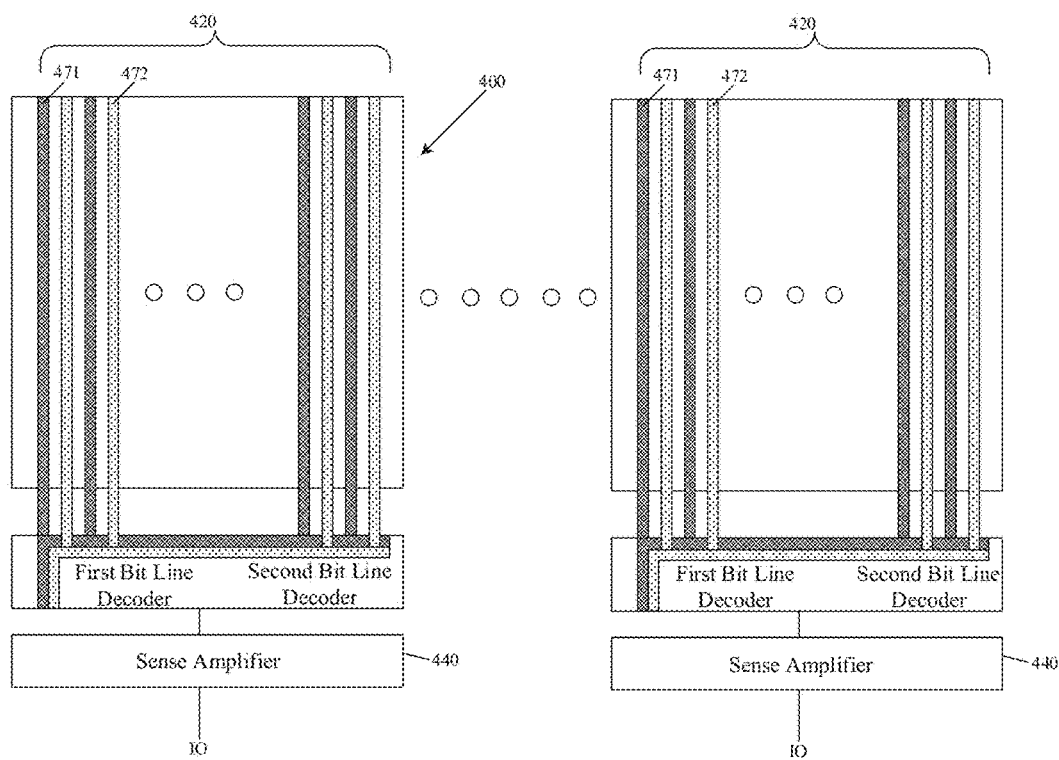
FIG. 4 illustrates a schematic local circuit diagram of the exemplary NVM shown in FIG. 3 consistent with various disclosed embodiments in the present disclosure.

In view of the problems described above, the present disclosure provides an NVM. FIG. 3 shows a schematic circuit diagram of an exemplary NVM consistent with disclosed embodiments. FIG. 4 shows a portion of the circuit diagram shown in FIG. 3.

Referring to FIG. 3 and FIG. 4, the NVM may include a plurality of memory unit regions 401 with each containing a memory array (not labeled). Moreover, the memory array may include a plurality of memory cells 402 arranged in a matrix. For illustration purpose, only one memory unit region 401 is shown in FIG. 3 and each memory cell 402 in the memory array of the memory unit region 401 may only store one bit of information. Further, along a direction from left to right, the array matrix of the memory cells 402 may include a plurality of to columns. Memory cells 402 arranged in the odd columns of the array matrix are first memory cells 411, and the memory cells arranged in even columns of the array matrix are second memory cells 412.

Further, the NVM may include a plurality of bit lines 420. The plurality of bit lines may further include odd bit lines 471 connected to the first memory cells 411 and even bit lines 472 connected to the second memory cells 412.

Each memory unit region 401 of the NVM may include a plurality of first bit line decoders 431 configured to send out a first output voltage Vi from the plurality of first memory cells 411 on the odd bit lines 471. Each first bit line decoder 431 may be connected to a corresponding odd bit line 471 and include a PMOS transistor P21 and two NMOS transistors N21 and N22.

Each memory unit region 401 of the NVM may also include a plurality of second bit line decoders 432 configured to send out a second output voltage $V_2$ from the plurality of second memory cells 412 on the even bit lines 472. Each second bit line decoder 432 may be connected to a corresponding even bit line 472 and include a PMOS transistor P22 and two NMOS transistors N23 and N24.

For example, the selection/deselection of BL<0> and the selection/deselection of BL<1> may be simultaneously controlled by signals applied to the transistors of the corresponding first bit line decoder 431 and the corresponding second bit line decoder 432. Specifically, when the information stored in the memory cell selected by the bit line BL<0> needs to be read out, the control signals, similar to bit line decoders, may enable the selection of BL<0> through transistors P21, N21, and N22. As such, the first output voltage $V_1$ stored in the memory cell corresponding to BL<0> may be sent to the first input terminal 441 of the sense amplifier 440. In the meantime, the control signals may be simultaneously sent to the transistors P22, N23, and N24 of the corresponding second bit line decoder 432 to ensure the deselection of BL<1>. Moreover, the first transistor 451 and the second transistor 452 of the enable unit 421 may be simultaneously controlled to allow the bias voltage $V_{ref}$ to be sent to the second input terminal 442 of the sense amplifier 440. The sense amplifier 440 may compare $V_1$ with the bias voltage $V_{ref}$ and send the result to the IO of the sense amplifier 440. As such, the information stored in the memory cell selected by bit line BL<0> may be read out.

Similarly, when the information stored in the memory cell selected by the bit line BL<1> needs to be read out, the control signals may enable the selection of BL<1> through transistors P22, N23, and N24. As such, the second output voltage $V_2$ stored in the memory cell corresponding to BL<1> may be sent to the second input terminal 442 of the sense amplifier 440. In the meantime, the control signals may be simultaneously sent to the transistors P21, N21, and N22 of the corresponding first bit line decoder 431 to ensure the deselection of BL<0>. Moreover, the first transistor 451 and the second transistor 452 of the enable unit 421 may be simultaneously controlled to allow the bias voltage $V_{ref}$ to be sent to the first input terminal 441 of the sense amplifier 440. The sense amplifier 440 may compare $V_2$ with the bias voltage $V_{ref}$ and send the result to the IO of the sense amplifier 440. As such, the information stored in the memory cell selected by bit line BL<1> may be read out.

Further, the plurality of first bit line decoders 431 and the plurality of second bit line decoders 432 may together form a Y-mux 400. The Y-mux 400 may have two output terminals. The plurality of first bit line decoders 431 and the plurality of second bit line decoders 432 in the Y-mux 400 are collectively controlled by decoder signals to send a first output voltage $V_1$ or a second output voltage $V_2$ and a bias voltage $V_{ref}$ to the two terminals. Specifically, when the data information stored in a first memory cell 411 needs to be read out, the corresponding decoder signals may be sent to the plurality of first bit line decoders 431 and the plurality of second bit line decoders 432 to allow the corresponding first output voltage $V_1$ to be sent to the output terminal connected to the plurality of first bit line decoders 431, and the bias voltage $V_{ref}$ to the other output terminal connected to the plurality of second bit line decoders 432. Similarly, when the data information stored in a second memory cell 412 needs to be read out, the corresponding decoder signals may be sent to the plurality of first bit line decoders 431 and the plurality of second bit line decoders 432 to allow the corresponding second output voltage $V_2$ to be sent to the output terminal connected to the plurality of second bit line decoders 432, and the bias voltage $V_{ref}$ to the other output terminal connected to the plurality of first bit line decoders 431.

Further, the NVM may include a comparator circuit corresponding to each memory unit region 401. In one embodiment, the comparator circuit may be an SA 440 may including a first input terminal 441, a second input terminal 442, and an output terminal 443. The first input terminal 441 may be connected to the plurality of first bit line decoders 431 while the second input terminal 442 may be connected to the plurality of second bit line decoders 432.

The NVM may also include a bias generation circuit 450. The bias generation circuit 450 may generate a bias voltage $V_{ref}$. In addition, the bias generation circuit 450 may be used to apply the bias voltage $V_{ref}$ to the second input terminal 442 when the first output voltage $V_1$ is applied to the first input terminal 441 so that the corresponding SA 440 may be able to read the information stored in the first memory cell 411 based on the voltage difference between the first output voltage $V_1$ and the bias voltage $V_{ref}$. Moreover, the bias generation circuit 450 may also be used to apply the bias voltage $V_{ref}$ to the first input terminal 441 when the second output voltage $V_2$ is applied to the second terminal 442 so that the corresponding SA 440 may be able to read the information stored in the second memory cell 412 based on the voltage difference between the second output voltage $V_2$ and the bias voltage $V_{ref}$.

Further, the plurality of memory cells 402 may be used to store data information that may need to be read out. In one embodiment, each memory cell 402 may include a control gate (CG, not shown), a floating gate (FG, not shown), and a select gate 410 (SG, referring to FIG. 3). Prior to performing a data reading operation, the data information to be read out may be stored in the FG of a memory cell 402. During the data reading operation, the channel region of the memory cell 402 may be turned on by controlling the SG 410 of the memory cell 402 such that outputting the first output voltage $V_1$ or the second output voltage $V_2$ may be realized.

Specifically, when reading the data information stored in a first memory cell 411, the corresponding first output voltage $V_1$ may be sent to the first input terminal 441 of the corresponding SA 440 through the Y-mux 400, and in the meantime, the bias voltage $V_{ref}$ may be sent to the second input terminal 442 of the SA 440 through the Y-mux 400. Similarly, when reading the data stored in a second memory cell 412, the corresponding second output voltage $V_2$ may be sent to the second input terminal 442 of the corresponding SA 440 through the Y-mux 400, and in the meantime, the bias voltage $V_{ref}$ may be sent to the first input terminal 441 of the SA 440 through the Y-mux 400.

The plurality of memory cells 402 may be duplicated cells. That is, the plurality of memory cells 402 may have an identical structure. In one embodiment, the memory cells are in the data reading state.

Further, the number of the columns of the memory array in each memory unit region 401 may be in a range from 256 to 4096, and the number of the rows of the memory array may be in a range from 256 to 2048.

For illustration purpose, the memory array is described to have 256 columns and 256 rows. Therefore, the memory cells located in the $1^{st}$ column, the $3^{rd}$ column . . . the $255^{th}$ column are the first memory cells 411; while the memory cells located in the 2$^{nd}$ column, the 4$^{th}$ column . . . the 256$^{th}$ column are the second memory cells 412.

In one embodiment, the number of the plurality of bit lines 420 is n, where n is an even number. Specifically, the bit lines 420 include BL<0>, BL<1>, BL<2>, BL<3>. . . BL<n-2>, and BL<n-1>. Moreover, BL<0>, BL<2>. . . BL<n-2> are connected to memory cells in the 1$^{st}$ column, the 3$^{rd}$ column . . . the (n-1)$^{th}$ column, respectively. That is, BL<0>, BL<2>. . . BL<n-2> are connected to the first memory cells 411, respectively. Therefore, BL<0>, BL<2>. . . BL<n-2> are odd bit lines 471. In the meantime, BL<1>, BL<3>. . . BL<n-1> are connected to memory cells in the 2$^{nd}$ column, the 4$^{th}$ column . . . the n$^{th}$ column, respectively. That is, BL<1>, BL<3>. . . BL<n-1> are connected to the second memory cells 412, respectively. Therefore, BL<1>, BL<3>. . . BL<n-1> are even bit lines 472. Moreover, the plurality of odd bit lines 471 and the plurality of even bit lines 472 are alternately arranged along the extending direction of the rows of the memory array.

Therefore, a plurality of first memory cells 411 in a same column of the memory array may share an odd bit line 471 while a plurality of second memory cells 412 in a same column of the memory array may share an even bit line 472.

In one embodiment, the NVM may include a plurality of memory unit regions 401 arranged along the extending direction of the rows of the memory array. Each memory unit region 401 may include memory cells 402 with an identical number of columns and an identical number of bit lines 420. In addition, in each memory unit region 401, the bit lines 420 may include a plurality of odd bit lines 471 and a plurality of even bit lines 472 alternately arranged along the extending direction of the rows of the memory array. The layout of bit lines 420 in different memory unit regions 401 may be the same. Moreover, the structure of the odd bit lines 471 and the structure of the even bit lines 472 may also be the same.

For example, a memory unit region 401 includes 6 columns of memory cells 402 and 6 bit lines 420. The bit lines 420 are arranged along the extending direction of the rows of the memory array in an order of BL<0>, BL<1>, BL<2>, BL<3>, BL<4>, and BL<5>. Among the 6 bit lines 420, BL<0>, BL<2>, and BL<4> are odd bit lines 471, while BL<1>, BL<3>, and BL<5> are even bit lines 472. In one embodiment, the number of columns in a memory unit region 401 is 128.

Further, the NVM may also include a plurality of word lines (not shown). Each word line may extend along a direction parallel to the extending direction of the rows of the memory array, and the plurality of word lines may be separated from each other along the extending direction of the columns of the memory array. Moreover, a plurality of memory cells 402 in a same row of the memory array may share one word line. Specifically, the word line may be connected to the CG of each memory cell 402.

The plurality of bit lines 420 and the plurality of word lines may together be used to control the data reading operation of the memory cells 402. In addition, the plurality of bit lines 420 and the plurality of word lines may also be used to determine the physical address of each memory cell 402. Specifically, the column address of a certain memory cell 402 may be determined through the plurality of bit lines 420, and the row address of the memory cell 402 may be determined through the plurality of word lines. As such, the complete address of the memory cell 402 that needs to be read in the memory array may then be determined.

Accordingly, the number of the bit lines 420 may be the same as the number of the columns of the memory array and the number of the word lines may be the same as the number of the rows of the memory array. In one embodiment, the number of bit lines 420 may be in a range from 256 to 4096, and the number of the word lines may be in a range from 256 to 2048.

In one embodiment, the plurality of first memory cells 411 may include a plurality of first SGs (not shown). For example, the first memory cells 411 may include SG<0>, SG<2>. . . SG<n-2>. The first SGs of the first memory cells 411 in a same row may be connected with each other. In addition, the plurality of second memory cells 412 may include a plurality of second SGs (not shown). For example, the second memory cells 412 may include SG<1>, SG<3>. . . SG<n-1>. The second SGs of the second memory cells 412 in a same row may be connected with each other. Moreover, the plurality of first SGs and the plurality of second SGs may together form the SGs 410.

In one embodiment, the NVM may also include alternately arranged first SG electrodes and second SG electrodes. Each first SG electrode may be connected to the first SGs of the first memory cells 411 in a corresponding row of the memory array and each second SG electrode may be connected to the second SGs of the second memory cells 412 in a corresponding row of the memory array. That is, the plurality of first memory cells 411 in a same row of the memory array may have a common SG 410 and the plurality of second memory cells 412 in a same row of the memory array may also have a common SG 410.

By distinguishing the SGs 410 for the first memory cells 411 and the second memory cells 412, the channel region of each first memory cell 411 or each second memory cell 412 may be turned on or turned off such that the data information stored in the first memory cell 411 or in the second memory cell 412 may then be read out.

In one embodiment, each memory unit region 401 of the NVM may also include a plurality of first bit line decoders 431 configured to send out a first output voltage $V_1$ from the plurality of first memory cells 411 on the odd bit lines 471. Each first bit line decoder 431 may be connected to a corresponding odd bit line 471 and include a PMOS transistor P21 and two NMOS transistors N21 and N22. Moreover, each memory unit region 401 of the NVM may also include a plurality of second bit line decoders 432 configured to send out a second output voltage $V_2$ from the plurality of second memory cells 412 on the even bit lines 472. Each second bit line decoder 432 may be connected to a corresponding even bit line 472 and include a PMOS transistor P22 and two NMOS transistors N23 and N24.

The selection/deselection of BL<0> and the selection/deselection of BL<1> may be simultaneously controlled by signals applied to the transistors of the corresponding first bit line decoder 431 and the corresponding second bit line decoder 432. Specifically, when the information stored in the memory cell selected by the bit line BL<0> needs to be read out, the control signals, similar to bit line decoders, may enable the selection of BL<0> through transistors P21, N21, and N22. As such, the first output voltage $V_1$ stored in the memory cell corresponding to BL<0> may be sent to the first input terminal 441 of the sense amplifier 440. In the meantime, the control signals may be simultaneously sent to the transistors P22, N23, and N24 of the corresponding second bit line decoder 432 to ensure the deselection of BL<1>. Moreover, the first transistor 451 and the second transistor 452 of the enable unit 421 may be simultaneously controlled to allow the bias voltage $V_{ref}$ to be sent to the second input terminal 442 of the sense amplifier 440. The sense amplifier 440 may compare $V_1$ with the bias voltage $V_{ref}$ and send the result to the IO of the sense amplifier 440. As such, the information stored in the memory cell selected by bit line BL<0> may be read out.

Similarly, when the information stored in the memory cell selected by the bit line BL<1> needs to be read out, the control signals may enable the selection of BL<1> through transistors P22, N23, and N24. As such, the second output voltage $V_2$ stored in the memory cell corresponding to BL<1> may be sent to the second input terminal 442 of the sense amplifier 440. In the meantime, the control signals may be simultaneously sent to the transistors P21, N21, and N22 of the corresponding first bit line decoder 431 to ensure the deselection of BL<0>. Moreover, the first transistor 451 and the second transistor 452 of the enable unit 421 may be simultaneously controlled to allow the bias voltage $V_{ref}$ to be sent to the first input terminal 441 of the sense amplifier 440. The sense amplifier 440 may compare $V_2$ with the bias voltage $V_{ref}$ and send the result to the IO of the sense amplifier 440. As such, the information stored in the memory cell selected by bit line BL<1> may be read out.

Further, corresponding to each memory unit region 401 of the NVM, the plurality of first bit line decoders 431 and the plurality of second bit line decoders 432 may together form a Y-mux 400. The Y-mux 400 may have two output terminals. When the data information stored in a first memory cell 411 needs to be read out, the corresponding decoder signals may be sent to the plurality of first bit line decoders 431 and the plurality of second bit line decoders 432 during the data reading operation to allow an output terminal of the Y-mux 400 to send out the corresponding first output voltage $V_1$, and the other output terminal of the Y-Mux 400 to send out a bias voltage $V_{ref}$. Similarly, when the data information stored in a second memory cell 412 needs to be read out, the corresponding decoder signals may be sent to the plurality of first bit line decoders 431 and the plurality of second bit line decoders 432 during the data reading operation to allow an output terminal of the Y-mux 400 to send out the corresponding second output voltage $V_2$, and the output terminal of the Y-Mux 400 to send out a bias voltage $V_{ref}$.

Specifically, in one embodiment, because each memory unit region 401 includes a plurality of first memory cells 411 and a plurality of second memory cells 412, the plurality of first memory cells 411 may send out a plurality of first output voltages $V_1$ and the plurality of second cells 412 may send out a plurality of second output voltages $V_2$. Further, controlled by decoder signals, the first output voltages $V_1$ may be sequentially applied to the first input terminal 441 through the first bit line decoders 431 of the Y-mux 400; in the meantime, the second output voltages $V_2$ may also be sequentially applied to the second input terminal 442 through the second bit line decoders 432 of the Y-mux 400.

That is, at any given moment, only one first output voltage $V_1$ of the first memory cells 411 on the odd bit lines 471 may be selected and sent out through the Y-mux 400, and only one second output voltage $V_2$ of the second memory cells 412 on the even bit lines 472 may be selected and sent out through the Y-mux 400.

Further, in one embodiment, when the SA 440 is used to compare the voltage at the first input terminal 441 with the voltage at the second input terminal 442, the difference between the voltages may be amplified. Therefore, the use of SA 440 may be conducive to comparing the voltages at the first input terminal 441 and the second input terminal 442, and thus may improve the data reading accuracy.

Moreover, the NVM may include a plurality of memory unit regions 401 and each memory unit region 401 may be connected to a corresponding SA 440 to allow the data information stored in the memory unit region 401 to be read out. As such, a plurality of SAs 440 may simultaneously read out a plurality of data stored in the NVM, and thus the data reading efficiency may be improved. Accordingly, the number of the SAs 440 may be equal to the number of the memory unit regions 401.

For example, the number of the columns of the memory array in the NVM may be in a range from 256 to 4096, and each memory unit region 401 in the NVM may include a memory array with 128 columns of memory cells 402. That is, the number of memory unit regions 401 in the NVM may be in a range from 2 to 32. Accordingly, the number of the SAs 440 in the NVM may also be in a range from 2 to 32.

In one embodiment, the bias generation circuit 450 may include a bias voltage source 423 used to generate a bias voltage $V_{ref}$, and an enable unit 421 connected to the first input terminal 441 and the second input terminal 442 of each SA 440. The enable unit 421 may be used to apply the first output voltage $V_1$ to the first input terminal 441 and also apply the bias voltage $V_{ref}$ to the second input terminal 442 so that the corresponding SA 440 may be able to read the information stored in the first memory cell 411 based on the voltage difference between the first output voltage $V_1$ and the bias voltage $V_{ref}$. Moreover, the enable unit 421 may also be used to apply the bias voltage $V_{ref}$ to the first input terminal 441 and also apply the second output voltage $V_2$ to the second terminal 442 so that the corresponding SA 440 may be able to read the information stored in the second memory cell 412 based on the voltage difference between the second output voltage $V_2$ and the bias voltage $V_{ref}$.

Specifically, the enable unit 421 may include a control unit (not shown), a first metal-oxide-semiconductor (MOS) transistor 451 and a second MOS transistor 452 connected to the control unit, the bias voltage source 423, and the corresponding SA 440. Moreover, the to control unit may be used to turn off the second MOS transistor 452 when the first MOS transistor 451 is turned on, and thus the first MOS transistor 451 may further apply the bias voltage $V_{ref}$ to the first input terminal 441. In addition, the control unit may also be used to turn on the second MOS transistor 452 when the first MOS transistor 451 is turned off, and thus the second MOS transistor 452 may further apply the bias voltage $V_{ref}$ to the second input terminal 442. That is, the control unit may simultaneously control the first MOS transistor 451 and the second MOS transistor 452 to allow the bias voltage $V_{ref}$ to be sent to only one input terminal of the corresponding SA 440 based on whether a first memory cell 411 or a second memory cell 412 is read out during the data reading operation.

In one embodiment, the first MOS transistor 451 may include a first gate electrode (not labeled), a first source electrode (not labeled), and a first drain electrode (not labeled), while the second MOS transistor 452 may include a second gate electrode (not labeled), a second source electrode (not labeled), and a second drain electrode (not labeled). Specifically, the first gate electrode and the second gate electrode may be connected to the control unit; the first source electrode and the second source electrode may be connected to the bias voltage source 423; the first drain electrode may be connected to the first input terminal 441; and the second drain electrode may be connected to the second input terminal 442.

In one embodiment, the first MOS transistor 451 is an NMOS transistor while the second MOS transistor 452 may be a PMOS transistor. In another embodiment, the first MOS transistor may be a PMOS transistor and the second MOS transistor may be an NMOS transistor.

Figure 5:
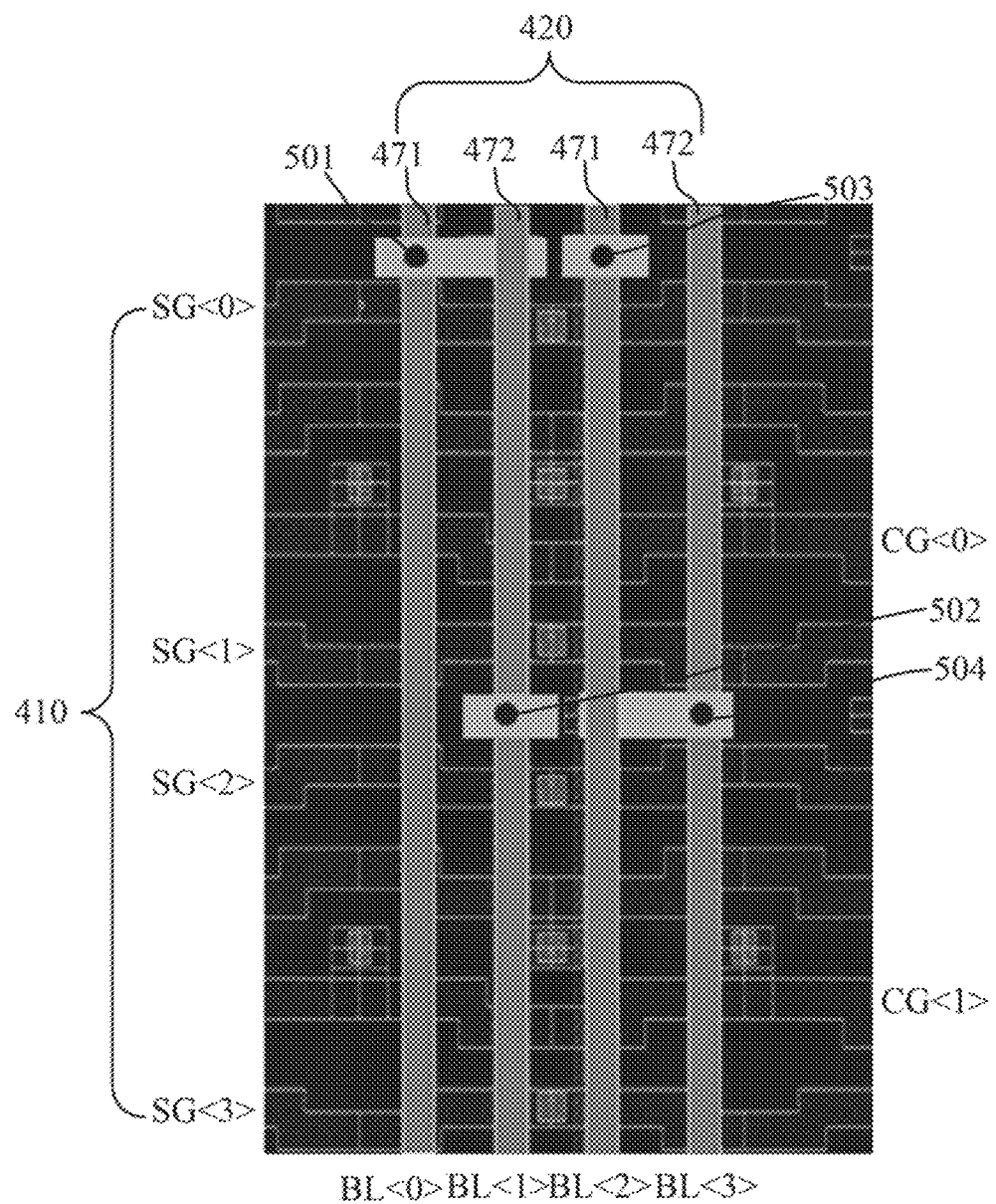
FIG. 5 illustrates a schematic local layout structure of the exemplary NVM shown in FIG. 3 consistent with various disclosed embodiments in the present disclosure.

FIG. 5 shows a schematic local layout structure of the exemplary NVM shown in FIG. 3. Referring FIG. 5, for illustration purpose, the local layout structure of the NVM is described to have four bit lines 420, i.e. BL<0>, BL<1>, BL<2>, and BL<3>. Specifically, the data reading operation of the first memory cells 411 corresponding to BL<0> and BL<2> may be realized by using a first via hole 501 on BL<0>, a third via hole 503 on BL<2>, a first metal layer (not shown) in connection with the first via hole 501 and the third via hole 503, and the common SGs 410 (such as SG<0> and SG<2>) shared by the first memory cells 411 in a same row of the memory array. Similarly, the data reading operation of the second memory cells 412 corresponding to BL<1> and BL<3> may be realized by using a second via hole 502 on BL<1>, a fourth via hole 504 on BL<3>, a second metal layer (not shown) in connection with the second via hole 502 and the fourth via hole 504, and the common SGs 410 (such as SG<0> and SG<2>) shared by the second memory cells 412 in a same row of the memory array.

Further, in one embodiment, the first memory cells 411 in a same column may share an odd bit line 471, while the second memory cells 412 in a same column may share an even bit line 472. Referring to the four bit lines 420 shown in FIG. 5, the first memory cells 411 in the first column of the memory array share BL<0>, the second memory cells 412 in the second column of the memory array share BL<1>, the first memory cells 411 in the third column of the memory array share BL<2>, and the second memory cells 412 in the fourth column of the memory array share BL<3>.

Further, in one embodiment, the first via hole 501, the second via hole 502, the third via hole 503, and the fourth via hole 504 may be via holes in a same layer while the first metal layer and the second metal layer may be in a same layer.

Moreover, the layout structure of the odd bit lines 471 may be identical to the layout structure of the even bit lines 472 so that the layout design and the fabrication process may be simplified.

During a data reading operation of the NVM, when a bit line voltage is applied only to the odd bit lines 471, i.e. the bit line voltage is not applied to the even bit lines 472, data stored in the first memory cells 411 may be accessed during the data reading operation. In contrast, when the bit line voltage is only applied to applied to the even bit lines 472, but not to the odd bit lines 471, data stored in the second memory cells 412 may be accessed during the data reading operation. As such, data stored in all memory cells (not shown) of the memory array may be read out.

Compared to conventional NVMs, the disclosed NVM may demonstrate several advantages. Usually, a conventional NVM includes a plurality main bit lines and one or more reference bit line. The structure of the reference bit line may be different from the structure of the main bit line. Moreover, the bit line voltage may never be applied to the reference bit line, and thus the reference bit line may not be used as a main bit line.

In comparison, according to the present disclosure, when an odd bit line 471 is used as a main bit line, an even bit line 472 may be used as a reference bit line, and alternatively, when an even bit line 472 is used as a main bit line, an odd bit line 471 may be used as a reference bit line. In addition, the structures of the odd bit line 471 and the even bit line 472 may be identical to each other while the fabrication process for the odd bit line 471 may also be the same as the fabrication process for the even bit line 472. Therefore, the odd bit line 471 and the even bit line 472 may have similar parasitic capacitance and leakage current so that data error caused by an overly large difference in the leakage current or the parasitic capacitance between the odd bit line 471 and the even bit line 472 may be avoided, and thus the data reading accuracy may be improved.

Moreover, according to the present disclosure, when an odd bit line 471 is used as a main bit line, an even bit line 472 may be used as a reference bit line, or when an even bit line 472 is used as a main bit line, an odd bit line 471 may be used as a reference bit line. As such, the information stored in all memory cells of the memory array may be read out. Therefore, the NVMs provided in the present disclosure may not require extra spaces for reference bit lines, and thus the disclosed NVMs may be conducive to the microminiaturization of NVMs.

Further, the present disclosure also provides a data reading method for NVMs. The data reading method may include providing an NVM consistent with the description above.

Referring to FIG. 3, the provided NVM may include at least one memory unit region 401 with each containing a memory array. For illustration purpose, only one memory unit region 401 is shown in FIG. 3. Further, the memory array of each memory unit region 401 may include a plurality of memory cells 402 arranged in a matrix and each memory cell 402 in the memory array of the memory unit region 401 may only store one bit of information. The plurality of memory cells 402 may be duplicated cells. That is, the plurality of memory cells 402 may have an identical structure. In one embodiment, the memory cells are in the data reading state. Moreover, along a direction from left to right, the array matrix of the memory cells may include a plurality of columns. Memory cells arranged in the odd columns of the array matrix are first memory cells 411, and the memory cells arranged in even columns of the array matrix are second memory cells 412.

Further, the NVM may include a plurality of bit lines 420. The bit lines 420 may include a plurality of odd bit lines 471 connected to the first memory cells 411 and a plurality of even bit lines 472 connected to the second memory cells 412.

A bias generation circuit 450 may be used to apply a bias voltage $V_{ref}$ to the second input terminal 442 of the SA 440 when a first output voltage $V_1$ is applied to the first input terminal 441 of a SA 440. Thus, the SA 440 may be used to read the information stored in a first memory cell 411 based on the voltage difference between the first output voltage $V_1$ and the bias voltage $V_{ref}$.

Alternatively, the bias generation circuit 450 may be used to apply the bias voltage $V_{ref}$ to the first input terminal 441 of the SA 440 when a second output voltage $V_2$ is applied to the second input terminal 442 of the SA 440. Thus, the SA 440 may be used to read the information stored in a second memory cell 412 based on the voltage difference between the second output voltage $V_2$ and the bias voltage $V_{ref}$.

In one embodiment, the process to apply the first output voltage $V_1$ to the first input terminal 441 of the SA 440 may include the following steps. First, a bit line voltage (not shown) may be sent to the odd bit lines 471 but not to the even bit lines 472 so that the first memory cells 411 corresponding to the odd bit lines 471 may be turned on while the second memory cells 412 corresponding to the even bit lines 472 may be turned off. Further, a first memory cell 411 may be selected from the plurality of first memory cells 411 connected to a same column such that the first output voltage $V_1$ may be applied to the first terminal 441 of the SA 440.

Moreover, the process for the SA 440 to obtain the information stored in the first memory cell 411 based on the voltage difference between the first output voltage $V_1$ and the bias voltage $V_{ref}$ may include when the first output voltage $V_1$ is greater than the bias voltage $V_{ref}$, the SA 440 may send out logic "1" as the information stored in the first memory cell 411 of the NVM; when the first output voltage $V_1$ is less than the bias voltage $V_{ref}$, the SA 440 may send out logic "0" as the information stored in the first memory cell 411 of the NVM.

In one embodiment, the process to apply the bias voltage $V_{ref}$ to the first input terminal 441 of the SA 440 and the second output voltage $V_2$ to the second input terminal 442 of the SA 440 may include the following steps. First, a bit line voltage (not shown) may be sent to the even bit lines 472 but not to the odd bit lines 471 so that the second memory cells 412 corresponding to the even bit lines 472 may be turned on while the first memory cells 411 corresponding to the odd bit lines 471 may be turned off. Further, a second memory cell 412 may be selected from the plurality of second memory cells 412 in a same column and the second output voltage $V_2$ may be applied to the second terminal 442 of the SA 440.

Further, the process for the SA 440 to obtain the information stored in the second memory cell 412 based on the voltage difference between the second output voltage $V_2$ and the bias voltage $V_{ref}$ may include when the second output voltage $V_2$ is greater than the bias voltage $V_{ref}$, the SA 440 may send out logic "1" as the information stored in the second memory cell 412 of the NVM; when the second output voltage $V_2$ is less than the bias voltage $V_{ref}$, the SA 440 may send out logic "0" as the information stored in the second memory cell 412 of the NVM.

In one embodiment, the first output voltage $V_1$ may be in a range of 0 V to 1.6 V, the second output voltage $V_2$ may be in a range of 0 V to 1.6 V, and the bias voltage $V_{ref}$ may be in a range of 0.7 V to 0.8 V.

In one embodiment, the bias generation circuit 450 may include a bias voltage source 423 used to generate a bias voltage $V_{ref}$ and an enable unit 421 connected to the first input terminal 441 and the second input terminal 442 of each SA 440. The enable unit 421 may be used to apply the first output voltage $V_1$ to the first input terminal 441 and also apply the bias voltage $V_{ref}$ to the second input terminal 442 so that the corresponding SA 440 may be able to read the information stored in the first memory cell 411 based on the voltage difference between the first output voltage $V_1$ and the bias voltage $V_{ref}$. Moreover, the enable unit 421 may also be used to apply the bias voltage $V_{ref}$ to the first input terminal 441 and also apply the second output voltage $V_2$ to the second terminal 442 so that the corresponding SA 440 may be able to read the information stored in the second memory cell 412 based on the voltage difference between the second output voltage $V_2$ and the bias voltage $V_{ref}$.

Specifically, the enable unit 421 may include a control unit (not shown), a first MOS transistor 451 and a second MOS transistor 452 connected to the control unit, the bias voltage source 423, and the corresponding SA 440.

Accordingly, during a process to read the information stored in the second memory cell 412, the control unit may turn off the second MOS transistor 452 and also turn on the first MOS transistor 451 such that the first MOS transistor 451 may apply the bias voltage $V_{ref}$ to the first input terminal 441. In addition, during a process to read the information stored in the first memory cell 411, the control unit may turn on the second MOS transistor 452 and also turn off the first MOS transistor 451 such that the second MOS transistor 452 may apply the bias voltage $V_{ref}$ to the second input terminal 442.

In one embodiment, the first MOS transistor 451 is an NMOS transistor while the second MOS transistor 452 may be a PMOS transistor. Accordingly, the process for the control unit to turn on the first MOS transistor 451 and turn off the second MOS transistor 452 may include applying a high-level voltage to the first MOS transistor 451 and the second MOS transistor 452; while the process for the control unit to turn off the first MOS transistor 451 and turn on the second MOS transistor 452 may include applying a low-level voltage to the first MOS transistor 451 and the second MOS transistor 452.

In another embodiment, the first MOS transistor is a PMOS transistor while the second MOS transistor is an NMOS transistor. Accordingly, the process for the control unit to turn off the first MOS transistor and turn on the second MOS transistor may include applying a high-level voltage to the first MOS transistor and the second MOS transistor; while the process for the control unit to turn on the first MOS transistor and turn off the second MOS transistor may include applying a low-level voltage to the first MOS transistor and the second MOS transistor.

Further, the NVM may include a plurality of memory unit regions 401 arranged along the extending direction of the rows of the memory array. Each memory unit region 401 may include a plurality of first memory cells 411 and a plurality of second memory cells 412. Accordingly, during the data reading operation, the plurality of first memory cells 411 may send out a plurality of first output voltages $V_1$, and the plurality of second memory cells 412 may send out a plurality of second output voltages $V_2$. Further, the plurality of first output voltages $V_1$ may then be sequentially received by the first input terminal 441 through a Y-mux 400; in addition, the plurality of second output voltages $V_2$ may also be sequentially received by the second input terminal 442 through the Y-mux 400.

The Y-mux 400 may be formed by a plurality of first bit line decoders 431 and a plurality of second bit line decoders 432. The first bit line decoders 431 may be connected to the plurality of odd bit lines 471 with each including a PMOS transistor P21 and two NMOS transistors N21 and N22. The first bit line decoders 431 may be configured to send out a first output voltage $V_1$ from the plurality of first memory cells 411 on the odd bit lines 471. The second bit line decoders 432 may be connected to the plurality of even bit lines 472 with each including a PMOS transistor P22 and two NMOS transistors N23 and N24. The second bit line decoders 432 may be configured to send out a second output voltage $V_2$ from the plurality of second memory cells 412 on the even bit lines 472.

The Y-mux 400 may have two output terminals. When the data information stored in a first memory cell 411 needs to be read out, the corresponding decoder signals may be sent to the plurality of first bit line decoders 431 and the plurality of second bit line decoders 432 during the data reading operation to allow an output terminal of the Y-mux 400 to send out the corresponding first output voltage $V_1$, and the other output terminal of the Y-Mux 400 to send out a bias voltage $V_{ref}$. Similarly, when the data information stored in a second memory cell 412 needs to be read out, the corresponding decoder signals may be sent to the plurality of first bit line decoders 431 and the plurality of second bit line decoders 432 during the data reading operation to allow an output terminal of the Y-mux 400 to send out the corresponding second output voltage $V_2$, and the output terminal of the Y-Mux 400 to send out a bias voltage $V_{ref}$.

That is, at any given moment, only one first output voltage $V_1$ of the first memory cells 411 on the odd bit lines 471 may be selected and sent out through the first bit line decoders 431 of the Y-mux 400. Thus, only one first output voltage $V_1$ may be applied to the first input terminal 441 of the SA 440 at any moment. Similarly, at any given moment, only one second output voltage $V_2$ of the second memory cells 412 on the even bit lines 472 may be sent out through the second bit line decoders 432 of the Y-mux 400. Thus, only one second output voltage $V_2$ may be applied to the second input terminal 442 of the SA 440 at any moment.

In one embodiment, when the SA 440 is used to compare the voltage at the first input terminal 441 with the voltage at the second input terminal 442, the difference between the voltages may be amplified. Therefore, the use of SA 440 may be conducive to comparing the voltages at the first input terminal 441 and the second input terminal 442, and thus may improve the accuracy of data reading.

Moreover, each memory unit region 401 may be connected to a corresponding SA 440 to allow the data information stored in the corresponding memory unit region 401 to be read out. As such, a plurality of SAs 440 may simultaneously read out a plurality of data stored in the NVM, and thus the data reading efficiency may be improved.

During a data reading operation of the NVM, when a bit line voltage is applied only to the odd bit lines 471, i.e. the bit line voltage is not applied to the even bit lines 472, data stored in the first memory cells 411 may be accessed during the data reading operation. In contrast, when the bit line voltage is only applied to applied to the even bit lines 472, but not to the odd bit lines 471, data stored in the second memory cells 412 may be accessed during the data reading operation. As such, data stored in all memory cells (not shown) of the memory array may be read out.

Specifically, according to the disclosed NVM, the structures of the odd bit line 471 and the even bit line 472 may be identical to each other while the fabrication process for the odd bit line 471 may also be the same as the fabrication process for the even bit line 472. Therefore, the odd bit line 471 and the even bit line 472 may have similar parasitic capacitance and leakage current so that data error caused by an overly large difference in the leakage current or the parasitic capacitance between the odd bit line 471 and the even bit line 472 may be avoided, and thus the data reading accuracy may be improved.

Compared to conventional NVMs with both main bit lines and one or more reference bit line, and the existing data reading methods, the disclosed NVM and the data reading method may demonstrate several advantages.

Specifically, according to the present disclosure, the NVM may include a memory array. The memory array may include a plurality of memory cells arranged into a matrix. Specifically, memory cells in the odd columns of the memory array are first memory cells and memory cells in the even columns of the memory array are second memory cells. The NVM may further include a plurality of bit lines. The bit lines may include a plurality of odd bit lines corresponding to the plurality of first memory cells and a plurality of even bit lines corresponding to the plurality of second memory cells. During a data reading operation to obtain the data information stored in the NVM, a bit line voltage may be applied only to the odd bit lines without affecting the even bit lines such that the information stored in the first memory cells may be accessed during the data reading operation. In contrast, the bit line voltage may be applied only to the even bit lines without affecting the odd bit lines such that the information stored in the second memory cells may be accessed during the data reading operation.

In conventional NVMs with both main bit lines and one or more reference bit line, the structure of the reference bit line may be different from the structure of the main bit line. Moreover, the bit line voltage may never be applied to the reference bit line, and thus the reference bit line may not be used as a main bit line.

In comparison, according to the disclosed NVM, when an odd bit line is used as a main bit line, an even bit line may be used as a reference bit line, and alternatively, when an even bit line is used as a main bit line, an odd bit line may be used as a reference bit line. In addition, the structure of the odd bit line may be identical to the structure of the even bit line while the fabrication process for the odd bit line may also be the same as the fabrication process for the even bit line. Therefore, the odd bit line and the even bit line may have similar parasitic capacitance and leakage current so that data error caused by an overly large difference in the to leakage current or the parasitic capacitance between the odd bit line and the even bit line may be avoided, and thus the data reading accuracy may be improved.

In addition, according to the present disclosure, by using an odd bit line as a main bit line and an even bit line as a reference bit line, or alternatively, using an even bit line as a main bit line and an odd bit line as a reference bit line, data stored in all memory cells of the memory array may be read out. Therefore, the disclosed NVMs may not require extra spaces for reference bit lines, and thus may be conducive to the microminiaturization of NVMs.

Further, the layout structure of the odd bit lines may be identical to the layout structure of the even bit lines and the fabrication process for the odd bit lines may be the same as the fabrication process for the even bit lines. Therefore, the layout design of the NVM and the fabrication process may be simplified.

According to the disclosed data reading method, during the data reading operation of the disclosed NVM, by applying a bit line voltage only to the odd bit lines without affecting the even bit lines, the information stored in the first memory cells may be accessed during the data reading operation; while by applying the bit line voltage only to the even bit lines without affecting the odd bit lines, the information stored in the second memory cells may be accessed during the data reading operation. That is, through the odd bit lines and the even bit lines, information of all memory cells may be read out. Compared to conventional NVMs and existing data reading methods, the disclosed NVM and the data reading method may allow an identical structure and an identical fabrication process for the odd bit lines and the even bit lines. Therefore, the odd bit line and the even bit line may have similar parasitic capacitance and leakage current so that data error caused by an overly large difference in the leakage current or the parasitic capacitance between the odd bit line and the even bit line may be avoided, and thus the data reading accuracy may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A non-volatile memory (NVM), comprising:
at least one memory unit region, each including a plurality of memory cells arranged into a memory array, wherein memory cells in odd columns of the memory array are first memory cells, and memory cells in even columns of the memory array are second memory cells;
a plurality of bit lines including odd bit lines connected to the first memory cells and even bit lines connected to the second memory cells;
a multiplexer (Y-mux) corresponding to each memory unit region and including a plurality of first bit line decoders connected to the odd bit lines and a plurality of second bit line decoders connected to the even bit lines;
a comparator circuit corresponding to each memory unit region and including a first input terminal connected to the plurality of first bit line decoders, a second input terminal connected to the plurality of second bit line decoders, and an output terminal; and
a bias generation circuit used to generate a bias voltage, wherein:
during an operation to read data information stored in a first memory cell, a control unit is configured to control the Y-mux is to send a first output voltage from the first memory cell to the first input terminal of the comparator circuit, and control the bias generation circuit to send the bias voltage to the second input terminal of the comparator circuit,
during an operation to read data information stored in a second memory cell, the control unit is configured to control the Y-mux is to send a second output voltage from the second memory cell to the second input terminal of the comparator circuit, and control the bias generation circuit to send the bias voltage to the first input terminal of the comparator circuit, and
the bias generation circuit includes:
a bias voltage source used to generate the bias voltage; and
an enable unit connected to the first input terminal and the second input terminal of the comparator circuit, wherein:
when the first output voltage is applied to the first input terminal, the enable unit is configured to send the bias voltage to the second input terminal such that the comparator circuit reads out the data information stored in the first memory cell based on a voltage difference between the first output voltage and the bias voltage,
when the second output voltage is applied to the second input terminal, the enable unit is configured to send the bias voltage to the first input terminal such that the comparator circuit reads out the data information stored in the second memory cell based on a voltage difference between the second output voltage and the bias voltage,
the enable unit includes a control unit, a first MOS transistor, and a second MOS transistor, wherein the first MOS transistor and the second MOS transistor are both connected to the control unit, the bias voltage source, and the comparator circuit;
when the control unit turns on the first MOS transistor and also turns off the second MOS transistor, the first MOS transistor applies the bias voltage to the first input terminal; and
when the control unit turns off the first MOS transistor and also turns on the second MOS transistor, the second MOS transistor applies the bias voltage to the second input terminal.

2. The NVM according to claim 1, wherein:
the first MOS transistor includes a first gate electrode, a first source electrode, and a first drain electrode; and
the second MOS transistor includes a second gate electrode, a second source electrode, and a second drain electrode, wherein:
the first gate electrode and the second gate electrode are both connected to the control unit;
the first source electrode and the second source electrode are both connected to the bias voltage source;
the first drain electrode is connected to the first input terminal; and
the second drain electrode is connected to the second input terminal.

3. The NVM according to claim 1, wherein:
the first MOS transistor is an N-type MOS (NMOS) and the second MOS transistor is a P-type MOS (PMOS); or
the first MOS transistor is a PMOS while the second MOS transistor is an NMOS.

4. The NVM according to claim 1, wherein a number of columns in the memory array is in a range of 256 to 4096.

5. The NVM according to claim 1, wherein a number of rows in the memory array is in a range of 256 to 2048.

6. The NVM according to claim 1, wherein the comparator circuit is a sense amplifier.

7. The NVM according to claim 1 including a plurality of memory unit regions arranged along a row direction of the memory array, wherein:
each memory unit region includes a same number of columns of the memory cells and a same number of bit lines.

8. The NVM according to claim 7, wherein:
each first memory cell includes a first select gate, and the first select gates of the first memory cells in a same row of the memory array are connected with each other; and
each second memory cell includes a second select gate, and the second select gates of the second memory cells in a same row of the memory array are connected with each other.

9. The NVM according to claim 8, further including alternately arranged first select gate electrodes and second select gate electrodes, wherein:
the first select gates of the first memory cells in a same row are connected to a first select gate electrode; and
the second select gates of the second memory cells in a same row are connected to a second select gate electrode.

10. A method for reading data information stored in an NVM, comprising:
providing an NVM including:
at least one memory unit region, each including a plurality of memory cells arranged into a memory array, wherein memory cells in odd columns of the memory array are first memory cells, and memory cells in even columns of the memory array are second memory cells,
a plurality of bit lines including odd bit lines connected to the first memory cells and even bit lines connected to the second memory cells, a multiplexer (Y-mux) corresponding to each memory unit region and including a plurality of first bit line decoders connected to the odd bit lines and a plurality of second bit line decoders connected to the even bit lines, a comparator circuit corresponding to each memory unit region and including a first input terminal connected to the plurality of first bit line decoders, a second input terminal connected to the plurality of second bit line decoders, and an output terminal, and a bias generation circuit used to generate a bias voltage, the bias generation circuit including an enable unit connected to the first input terminal and the second input terminal of the comparator circuit, the enable unit including a control unit, a first MOS transistor and a second MOS transistor, wherein the first MOS transistor and the second MOS transistor are both connected to the control unit, a bias voltage source used to generate the bias voltage, and the comparator circuit;

during an operation to read data information stored in a first memory cell, sending a first output voltage from the first memory cell to the first input terminal of the comparator circuit through the Y-mux, and the bias voltage to the second input terminal of the comparator circuit through the bias generation circuit, and during an operation to read data information stored in a second memory cell, sending a second output voltage from the second memory cell to the second input terminal of the comparator circuit through the Y-mux, and the bias voltage to the first input terminal of the comparator circuit through the bias generation circuit, wherein:

when the first output voltage is applied to the first input terminal, the enable unit is configured to send the bias voltage to the second input terminal such that the comparator circuit reads out the data information stored in the first memory cell based on a voltage difference between the first output voltage and the bias voltage, when the second output voltage is applied to the second input terminal, the enable unit is configured to send the bias voltage to the first input terminal such that the comparator circuit reads out the data information stored in the second memory cell based on a voltage difference between the second output voltage and the bias voltage;

the enable unit includes a control unit, a first MOS transistor, and a second MOS transistor, wherein the first MOS transistor and the second MOS transistor are both connected to the control unit, the bias voltage source, and the comparator circuit when the control unit turns on the first MOS transistor and also turns off the second MOS transistor, the first MOS transistor applies the bias voltage to the first input terminal; and when the control unit turns off the first MOS transistor and also turns on the second MOS transistor, the second MOS transistor applies the bias voltage to the second input terminal.

11. The method for reading data information stored in the NVM according to claim 10, wherein the comparator circuit is a sense amplifier.

* * * * *